United States Patent
Yamamoto

(10) Patent No.: US 6,290,746 B1
(45) Date of Patent: Sep. 18, 2001

(54) METHOD OF PRODUCING METAL BALL AND SEMICONDUCTOR PACKAGE

(75) Inventor: Masaharu Yamamoto, Osaka (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/448,447

(22) Filed: Nov. 24, 1999

(30) Foreign Application Priority Data

Nov. 26, 1998 (JP) .................................................. 10-336038

(51) Int. Cl.$^7$ ........................................................ B22P 7/02
(52) U.S. Cl. .................................. 75/342; 75/363; 164/46
(58) Field of Search .............................. 75/340, 342, 357, 75/363; 164/46, 75

(56) References Cited

U.S. PATENT DOCUMENTS

| 3,652,259 | * | 3/1972 | Knopp | 75/342 |
| 5,586,715 | * | 12/1996 | Schwiebert et al. | 75/357 |

FOREIGN PATENT DOCUMENTS

| 486778 | * | 6/1938 | (GB) | 75/342 |
| 59-190303 | * | 10/1984 | (JP) | 75/342 |
| 60-005804 | * | 1/1985 | (JP) | 75/342 |
| 10/8113 | | 1/1998 | (JP) . | |
| 95/24113 | | 9/1995 | (WO) . | |

* cited by examiner

Primary Examiner—George Wyszomierski
(74) Attorney, Agent, or Firm—Dykema Gossett PLLC

(57) ABSTRACT

The purpose of the present invention is to improve releasability from the jig of a method of producing a minute metal ball by heating and melting and then cooling a metal piece of specific dimensions and further, to present a metal ball with very good dimensional accuracy and sphericity, even though diameter is minute. By means of the above-mentioned method, very good releasability between the metal ball and jig after melting and cooling is obtained and long-term use of the tool becomes possible by placing a metal piece on a jig with a layer of fine powder of BN, AlN or C having low wettability with the metal piece in between, or by making a layer of fine powder adhere to the surface of the metal piece and then placing this metal piece on the jig or shaking and arranging individual metal pieces in holes in the same. Moreover, the layer of fine powder on the jig or the surface of the metal piece used in the method of the present invention does not prevent spheroidising of the metal piece under surface tension during melting, and there is no deterioration of surface properties of the metal ball that is obtained and it is thereby possible to markedly improve dimensional accuracy and sphericity of the metal ball.

3 Claims, No Drawings

METHOD OF PRODUCING METAL BALL AND SEMICONDUCTOR PACKAGE

BACKGROUND OF THE INVENTION

1. Field of the Invention

The present invention pertains to a method of producing a metal ball of Cu, etc., that is effective as a bump for semiconductor packages by heating and melting and then cooling a small metal piece, and a semiconductor package that uses the same ball. The present invention pertains to a method with which good relebiity from the jig during cooling after heating and melting and dimensional accuracy of the metal ball are guaranteed and productivity s markedly improved by, for instance, placing a metal piece on the jig with a layer of fine powder having low wettability with the metal piece in between.

2. Description of the Prior Art

Minute metal balls of Cu, Al, Ni, etc., are used as bumps for BGA (ball grid array)-type semiconductor packages, ornamental materials, wiring electrodes, relay contacts, etc. The method whereby a metal piece cut from a metal wire with dimensions similar to the intended diameter is heated and melted on a flat jig and then made into a sphere under surface tension (Japanese Patent Application No. 58-113586 (Japanese Patent Laid-Open No. 60-5804)) is a method of producing the same.

The method whereby metal pieces are individually shook into and arranged in a plurality of holes formed in a jig and these metal pieces are heated with the jig at a temperature that is the melting point or higher in a non-oxidizing atmosphere and melted is disclosed as a method of increasing sphericity further (WO 95/24113).

Moreover, the method whereby metal pieces are buried in powder that is mainly graphite powder and heated and melted to produce metal balls is presented as a simple method for efficient production (Japanese Patent Laid-Open No. 10-8113).

Methods that use the above-mentioned jig are excellent in terms of handling performance because large quantities of metal pieces can be handled at the same time. However, not only is dimensional accuracy inferior when the surface of the metal ball that comes into contact with the jig is flat, but releasability of the metal ball after melting also becomes poor with degradation of the jig, life of the jig is curtailed, and there is a reduction in production efficiency. This tendency is particularly obvious with a minute diameter of a diameter of 0.4 mm or less.

The surface state is poor because metal pieces are buried in powder by the above-mentioned production methods that use fine powder. Moreover, there are cases where dimensional accuracy is an error of ±0.1 m in terms of the desired dimensions.

SUMMARY OF THE INVENTION

The purpose of the present invention is to improve releasability from the jig of the method wherein minute metal balls are made by heating and melting and then cooling metal pieces of specific dimensions. The purpose of the present invention is to present a method of producing a metal ball with very good dimensional accuracy and sphericity, even though diameter is minute, and a semiconductor package that uses the same ball.

The inventors performed various studies of methods of using fine powder for the purpose of improving releasability from the jig after melting and cooling and improving sphericity. As a result, they discovered that releasability from the jig after melting and cooling is extremely good and long-term use of the jig becomes possible by the method wherein a metal piece is placed on a jig with a layer of fine powder having low wettability with this metal piece material in between, or placing the metal piece on the jig or shaking and arranging individual metal pieces in holes in the same after a layer of this fine powder is made to adhere to the surface of the metal piece. Moreover, the inventors completed the present invention upon discovering that the abovementioned method markedly improves dimensional accuracy and ephericty of the metal ball because the layer of fine powder on the jig or the surface of the metal piece does not prevent spheroidizing under surface tension when the metal piece is melted and there is no deterioration of surface properties of the metal ball that is obtained.

That is, the method of producing a metal ball of the present invention comprises the steps of placing a metal piece of Cu, Al, Ni, etc., at the fixed position on a heat treatment jig with a layer of fine powder, which has an average particle deter of 2 $\mu$m to 10 $\mu$m and which consists of BN, AlN, or C having low wettability with the metal piece material, at a thickness of 5 $\mu$m to 50 $\mu$m in between, or with a layer of this fine powder made to adhere to the surface of the metal piece, heating and melting the metal piece, and then cooling the metal piece so that it solidifies into a spherical shape.

The production method of the present invention provides extremely good releasability between the metal ball and jig after melting and cooling and makes long-term use of the jig possible by using means wherein a metal piece is placed on the jig with a layer of fine powder having low wettability with this metal piece in between, or wherein a layer of this fine powder is made to adhere to the metal piece surface. Moreover, the present invention makes possible marked improvement of dimensional accuracy and sphericity of the metal ball that is obtained because the layer of fine powder on the jig or at the metal piece surface does not prevent spheroidizng of the metal piece under surface tension and there is no deterioration of the surface properties of the same when the metal piece is melted.

DETAILED DESCRIPTION OF PREFERRED EMBODIMENTS

Either metals or alloys can be used as the material from which the metal ball is made in the present invention.

Cu, Al, Ni and their alloys are ideal for use as bumps of semiconductor packages, ornamental materials, wiring electrodes, relay contacts, etc.

The metal piece is made by determining the dimensions of a piece in accordance with the intended volume of the Cu ball and cutting a piece from a Cu wire Cu wire. In order to improve productivity, the relative L/D of the wire material outer diameter and cut length L with which spheroidizing is most efficient can be set in accordance with the jig that is used, the hole shape of the jig, etc.

A powder material having low wettability with the metal piece material that is used can be selected as needed in accordance with this material for the fine powder of the present invention. For instance, BN, AlN, and C are desirable as the fine powder with low wettability with Cu, Al, Ni or their alloys, etc. The average diameter of the abovementioned fine powder is preferably within a range of 2 $\mu$m to 10 $\mu$m. The reason for this is that if it is less than 2 $\mu$m, there will be a reduction in fluidity of the powder and a layer cannot be formed on the jig or the surface of the metal ball and if it exceeds 10 μm, surface properties of the metal ball will change for the worse.

The fine powder is used in the form of a thin film layer with respect to the metal piece in any case. In the concrete, a layer of the fine powder of 5 μm to 50 μm is spread on the jig or Wide the plurality of indentations in the jig and the metal piece is then placed on top, or a layer of the fine powder of 5 μm to 50 μm is made to adhere to the surface of the metal piece.

The reason for sing of layer of fine powder with a thickness of 5 μm to 50 μm in the present invention is that if the thickness of the layer of fine powder is less than 5 μm, there will be scatter in the effects of the powder in terms of improving releasability from the jig. Moreover, if it exceeds 50 μm, it will be difficult to make the fine powder adhere to the surface of a wire material obtained by conventional methods and at the same time, there will be an extreme drop in thermal conductivity and therefore, the cooling temperature will be delayed and the state of the surface of the metal ball will change for the worse.

The following various methods can be used as a method of using a fine powder.

The method wherein after the fine powder has been spread on the jig to form the above-mentioned layer, metal pieces are shook into and placed in the jig with, for instance, a vibrating feeder The method wherein the particles of the fine powder are fed together and a layer of this powder is thereby made to adhere to the surface while the metal pieces are being fed with a vibrating feeder, etc., or before they are shook into the jig.

The method whereby after the above-mentioned layer of fine powder has been placed on a flat jig, a jig plate with through holes for shaking the powder into the jig is placed on top and the metal pieces are shook through these through holes into the jig and onto the fine powder.

Moreover, in order to prevent mixing of impurities, the surface of the metal piece can be washed (defatted) with a nonionic higher alcohol detergent, neutral detergent, organic solvent, etc., before a layer of the fine powder is made to adhere to the metal pieces or jig.

It is desirable that the heat treatment jig used in the present invention be a material having low wettability with the molten metal. For instance, carbon, a ceramic of alumina or silicon carbide, etc., heat-resistant steel on the surface of which an oxide coating has been formed, etc., can be used. There is an advantage to using a sintered compact of BN, AlN, or C, am which are used as the above-mentioned fine powder, alone or as a compound, as the jig material in that wettability with the metal piece is low and thermal conductivity is good and it is easy to release the metal balls.

A composite material of BN and AlN is particularly preferred as this jig material from various viewpoints, including strength, heat conductivity, workability for producing the holes and indentations for shaking powder into the jig, etc. The preferred mixture percentages of the above-mentioned compound material is 20 to 40 wt% BN in order to obtain stability in a high-temperature atmosphere and 60 to 80 wt% AlN in order to obtain good mechanical workability In addition, the average particle diameter of the BN/AlN compound starting materials for sintering is preferably 2 μm to 50 μm. The sintering conditions should be selected so that heat conductivity is 15 W/m or higher at 1,000° C. and 30 W/m or higher at 1,200° C. Moreover it is preferred that density be 2.6 to 2.8 g/cm$^3$ and bending strength be 60 to 80 Mpa.

The atmosphere in which the metal piece is melted and solidified should be a non-oxidizing atmosphere, such as a hydrogen atmosphere, nitrogen atmosphere, vacuum, etc. The reason for this is so that an oxide will not be formed during melting and solidification and so that there will not be a reduction in dimensional accuracy, destabilization of electrical properties due to mixing of oxide, a reduction in adhesion strength, such as fluctuations in adhesion in accordance with later requirements, etc.

The temperature of heating and melting in the case of, for r instance, a Cu piece must be a temperature that is the melting point of Cu (1,084° C.) or higher. However, higher dimensional accuracy is not obtained if the temperature is higher than necessary and taking into consideration economics and work performance, a range of 1,100° C. to 1,250° C. is preferred and a range of 1,100° C. to 1,150° C. is further preferred Any conventional separation and cleaning method can also be used as the method for removing the fine powder that adheres to the metal ball that has been obtained. For instance, the wet ultasonic cleaning method, etc., is preferred.

The metal ball of tie present invention can fully satisfy today's requirements of reduced package size and multi-pin form of semiconductor packages, for instance, BGA-type packages, that use this metal ball because it has very good dimensional accuracy and sphericity, even though diameter is minute. Moreover, for the same reason, it is ideal for wiring electrodes or relay contacts,

EMBODIMENTS

Embodiment 1

A carbon jig with indentations at specific intervals was used to produce Cu balls with a sphere diameter of 0.25 mm and 0.75 mm. A layer of BN powder with a particle diameter of 7 to 10 μm was spread to 5 μm to 50 μm on the surface of indentations in a jig and Cu pieces were shook into these indentations. The pieces were heated and melted for 5 minutes at 1,100° C. in a 100% $N_2$ atmosphere. Then they were cooled and separated from the jig ultrasonic washing was performed to obtain Cu balls.

The sphere diameter accuracy, sphercity, and released percentage when the tool was used 10 times (shown in parentheses in the table columns) of the Cu balls that were obtained were investigated The determination results are shown in Table 1 when sphere diameter was 0.25 mm and are shown in Table 2 when sphere diameter was 0.75 mm.

Furthermore, sphere diameter accuracy was found by determining the diameter of the balls using a projector. Sphericity was found from the difference between the maximum and the minimum diameter using the formula of sphericity % =(1−|(maximum−minimum)/average diameter|)×100. The released percentage is the ratio released from the jig under the dead weight of the balls and this ratio was found by counting the number released with 6,000 balls/1 jig.

Comparison 1

Other than the fact that a layer of BN powder was not spread on the surface of the indentations in the jig, ball were made under the same conditions as in Embodiment 1 and sphere diameter accuracy, sphericity, released percentage and further, released percentage when the jig was used 10 times (shown in parentheses in the table column) of the Cu balls that were obtained were investigated. The detention results are shown in Table 1 when sphere diameter was 0.25 mn and are shown in Table 2 when sphere diameter was 0.75 mm.

Embodiment 2

A carbon jig with indentations at specific intervals was used to make Cu balls with a sphere diameter of 0.25, mm and 0.75 mm. A layer of Cu powder with a particle diameter of 7 to 10 $\mu$m was spread to 5 $\mu$m to 50 $\mu$m on the surface of indentations in the jig and Cu pieces were shook into each indentation. The pieces were heated and melted for 5 minutes at 1,100° C. in a 100% $N_2$ atmosphere. The product was then cooled and separated from the jig and ultrasonic washing was performed to obtain Cu balls.

Sphere diameter accuracy, sphericity, and the released percentage of the Cu balls that were obtained were determined by the same method as in Embodiment 1. The determination results are shown in Table 1 when sphere diameter was 0.25 mm and in Table 2 when sphere diameter was 0.75 mm

Comparison 2

Metal balls were produced under the same conditions as in Embodiment 2 in terms of the atmosphere, heating, etc., using the method wherein after C powder was spread on the jig to a thickness of 1 mm, Cu pieces were placed on top of the same and then coated with C powder to a thickness of 1 mm. The sphere diameter accuracy, sphericity, and released percentage of the Cu balls that were obtained were investigated. The destination results are shown in Table 1 when sphere diameter was 0.25 mm and in Table 2 when sphare diameter was 0.75 mm.

Embodiment 3

A BN/AlN sintered compact jig (BN/AlN=4:6) with indentations at specific intervals was used in order to produce Cu balls with a sphere diameter of 0.25 mm and 0.75 mm. A layer of AlN powder with a particle diameter of 7 to 10 $\mu$m was spread to 5 $\mu$m to 50 $\mu$m on the surface of the indentations in the tool and Cu pieces were shook into each indentation and heated and melted for 5 minutes at 1,100° C. in a 100% $N_2$ atmosphere. Then the pieces were cooled and separated from the jig and ultrasonic cleaning was performed to obtain Cu balls.

Sphere diameter accuracy, sphercity and the released percentage of the Cu balls that were obtained were investigated as in Embodiment 1 and the results are shown in Table 1 when sphere diameter was 0.25 mm and in Table 2 when sphere diameter was 0.75 mm.

Comparison 3

Other than the fact that a layer of AlN powder was not spread on the surface of indentations in the jig, metal balls were made under the same conditions as in Embodiment 2. Sphere diameter accuracy, sphericity, and the released percentage of the Cu balls that were obtained were investigated and the results of the same are shown in Table 1 when sphere diameter was 0.25 mm and in Table 2 when sphere diameter was 0.75 mm.

Embodiment 4

A BN/AlN sintered compact jig (BN/AlN=4:6) with indentations at spheric intervals was used to produce Al balls with a sphere diameter of 0.25 mm and 0.75 mm. A layer of BN powder with a particle diameter of 7 to 10 $\mu$m was spread to 5 $\mu$m to 50 $\mu$m on the surface of the indentations in the tool and Al pieces were shook into each indentation and heated and melted for 5 minutes at 1,100° C. in a vacuum. Then the balls were cooled and separated from the jig and ultrasonic cleaning was performed to obtain Al balls.

The sphere diameter accuracy, sphericity, and released percentage of the Al balls that were obtained were investigated as in Embodiment 1. The determination results are shown in Table 1 when sphere diameter was 0.25 mm and in Table 2 when sphere diameter was 0.75 mm.

Comparison 4

Other than the fact that a layer of BN powder was not spread on the surface of indentations in the jig, metal balls were made under the same conditions as in Embodiment 2. Sphere diameter accuracy, sphericity, and the released percentage of the Al balls that were obtained were investigated and the results are shown in Table 1 when sphere diameter was 0.25 mm and in Table 2 when sphere diameter was 0.75 mm.

TABLE 1

| | Holder//powder | Ball diameter (mm) | Released percentage (%) | Sphere diameter accuracy (mm) | Sphericity (%) |
|---|---|---|---|---|---|
| Embodiment 1 | C//BN | 0.25 | 100(100) | ±0.005 | 96 |
| Embodiment 2 | C//C | 0.25 | 100 | ±0.005 | 96 |
| Embodiment 3 | (BN/AlN)//AlN | 0.25 | 100 | ±0.005 | 96 |
| Embodiment 4 | (BN/AlN)//BN | 0.25 | 100 | ±0.005 | 96 |
| Comparison 1 | C//— | 0.25 | 50(0) | ±0.025 | 80 |
| Comparison 2 | C//C | 0.25 | 100 | ±0.025 | 80 |
| Comparison 3 | (BN/AlN)//— | 0.25 | 50 | ±0.010 | 92 |
| Comparison 4 | (BN/AlN)//— | 0.25 | 50 | ±0.010 | 92 |

TABLE 2

| | Holder//powder | Ball diameter (mm) | Released percentage (%) | Sphere diameter accuracy (mm) | Sphericity (%) |
|---|---|---|---|---|---|
| Embodiment 1 | C//BN | 0.75 | 100(100) | ±0.015 | 97 |
| Embodiment 2 | C//C | 0.75 | 100 | ±0.015 | 97 |
| Embodiment 3 | (BN/AlN)//AlN | 0.75 | 100 | ±0.015 | 97 |
| Embodiment 4 | (BN/AlN)//BN | 0.75 | 100 | ±0.015 | 97 |
| Comparison 1 | C//— | 0.75 | 50(0) | ±0.035 | 90 |
| Comparison 2 | C//C | 0.75 | 100 | ±0.035 | 90 |
| Comparison 3 | (BN/AlN)///— | 0.75 | 90 | ±0.025 | 94 |
| Comparison 4 | (BN/AlN)//— | 0.75 | 90 | ±0.025 | 94 |

According to Tables 1 and 2, sphere diameter accuracy and sphericity of the Embodiments of the present invention are better when compared to the Comparison, and it is obvious that the released percentage is markedly better.

What is claimed is:

1. A method of producing spherical metal balls using a heat treatment jig which comprises the steps of:

(a) coating metal pieces selected from the group consisting of Cu, Al, Ni and alloys thereof and located at a predetermined position on said heat treatment jig with a fine powder of a compound selected from the group consisting of BN and AlN, said fine powder having an average particle diameter of 2 to 10 $\mu$m and said coating having a thickness of 5 to 50 $\mu$m, (b) heating and melting said metal pieces, and (c) cooling said coated metal pieces so as to solidify said coated metal pieces into said spherical metal balls.

2. The method of producing a metal ball according to claim 1, wherein the heat treatment jig is a sintered compact consisting of 20 to 40 wt % BN and 60 to 80 wt % AlN.

3. A method according to claim 1, wherein said spherical metal balls have a sphericity of at least 96%.

* * * * *